United States Patent [19]
Tihanyi

[11] Patent Number: 6,150,694
[45] Date of Patent: Nov. 21, 2000

[54] SILICON-ON-INSULATOR INSULATED GATE BIPOLAR TRANSISTOR

[75] Inventor: Jenoe Tihanyi, Kirchheim, Germany

[73] Assignee: Infineon Technologies AG, Munich, Germany

[21] Appl. No.: 09/395,319

[22] Filed: Sep. 13, 1999

Related U.S. Application Data

[63] Continuation of application No. PCT/DE98/03590, Dec. 7, 1998.

[30] Foreign Application Priority Data

Jan. 14, 1998 [DE] Germany ............ 198 01 093

[51] Int. Cl.[7] ............ H01L 29/76; H01L 27/01
[52] U.S. Cl. ............ 257/335; 257/337; 257/350
[58] Field of Search ............ 257/335, 337, 257/347, 350, 354

[56] References Cited

U.S. PATENT DOCUMENTS

| | | | |
|---|---|---|---|
| 5,396,087 | 3/1995 | Baliga . | |
| 5,416,354 | 5/1995 | Blackstone | 257/499 |
| 5,514,885 | 5/1996 | Myrick | 257/216 |
| 5,608,252 | 3/1997 | Nakato | 257/347 |

FOREIGN PATENT DOCUMENTS

| | | |
|---|---|---|
| 0 768 717 A2 | 4/1997 | European Pat. Off. . |
| 195 38 090 A1 | 4/1997 | Germany . |

OTHER PUBLICATIONS

Japanese Patent Abstract No. 02135781 (Teruyoshi), dated May 24, 1990.

*Primary Examiner*—Ngân V. Ngô
*Attorney, Agent, or Firm*—Herbert L. Lerner; Laurence A. Greenberg; Werner H. Stemer

[57] ABSTRACT

A silicon-on-insulator insulated gate bipolar transistor (SOI-IGBT) has a channel zone of a first conductivity type, at least one cell zone of a second conductivity type, and at least one intermediate zone of the first conductivity type which delimits the SOI-IGBT. The channel zone, the cell zone, and the intermediate zone are disposed in an insulator layer, which is provided on a semiconductor body of the first conductivity type. The channel zone, the cell zone, and the intermediate zone are connected to the semiconductor body via openings provided in the insulator layer. A semiconductor configuration having a CMOS circuit integrated with an SOI-IGBT is also provided.

12 Claims, 4 Drawing Sheets

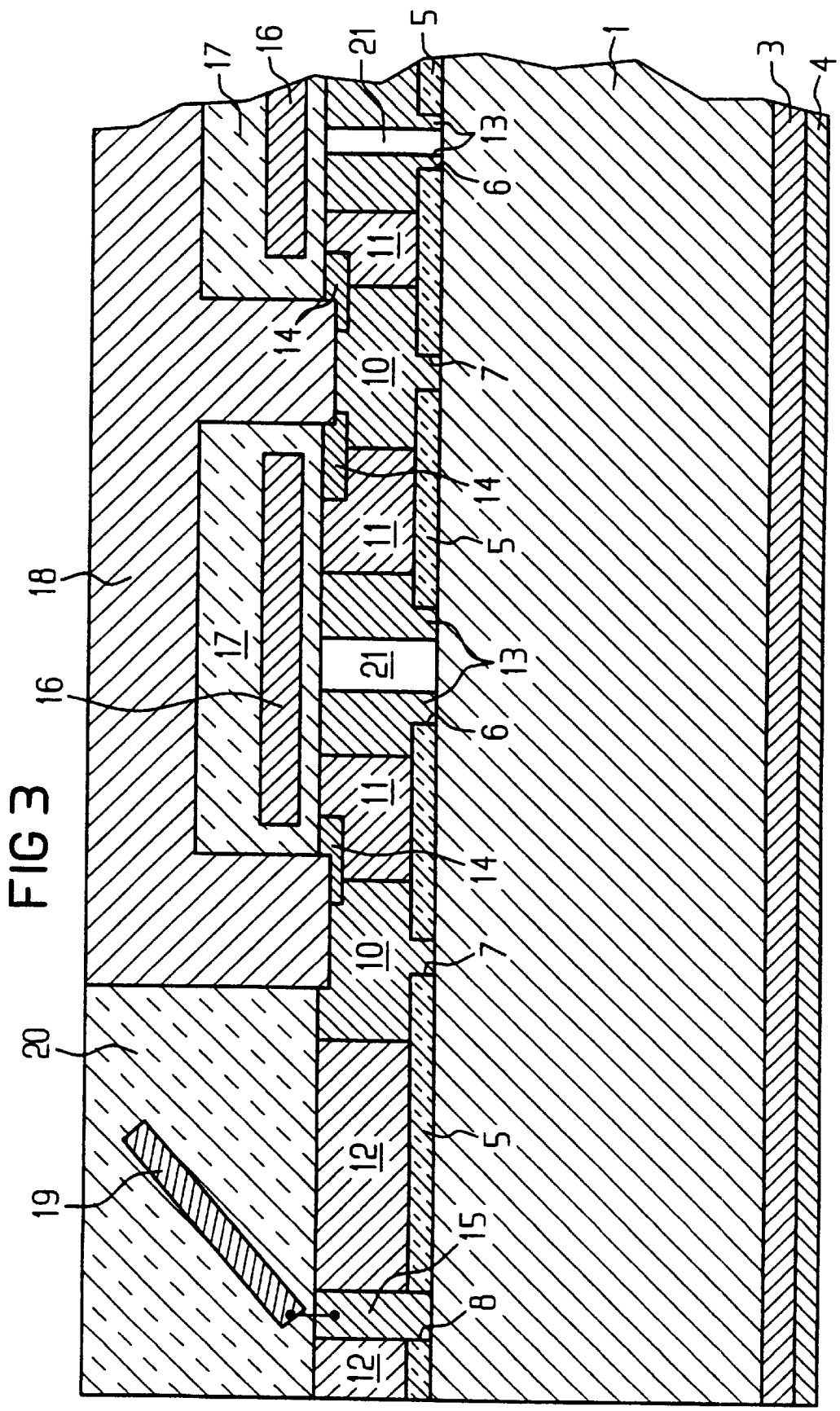

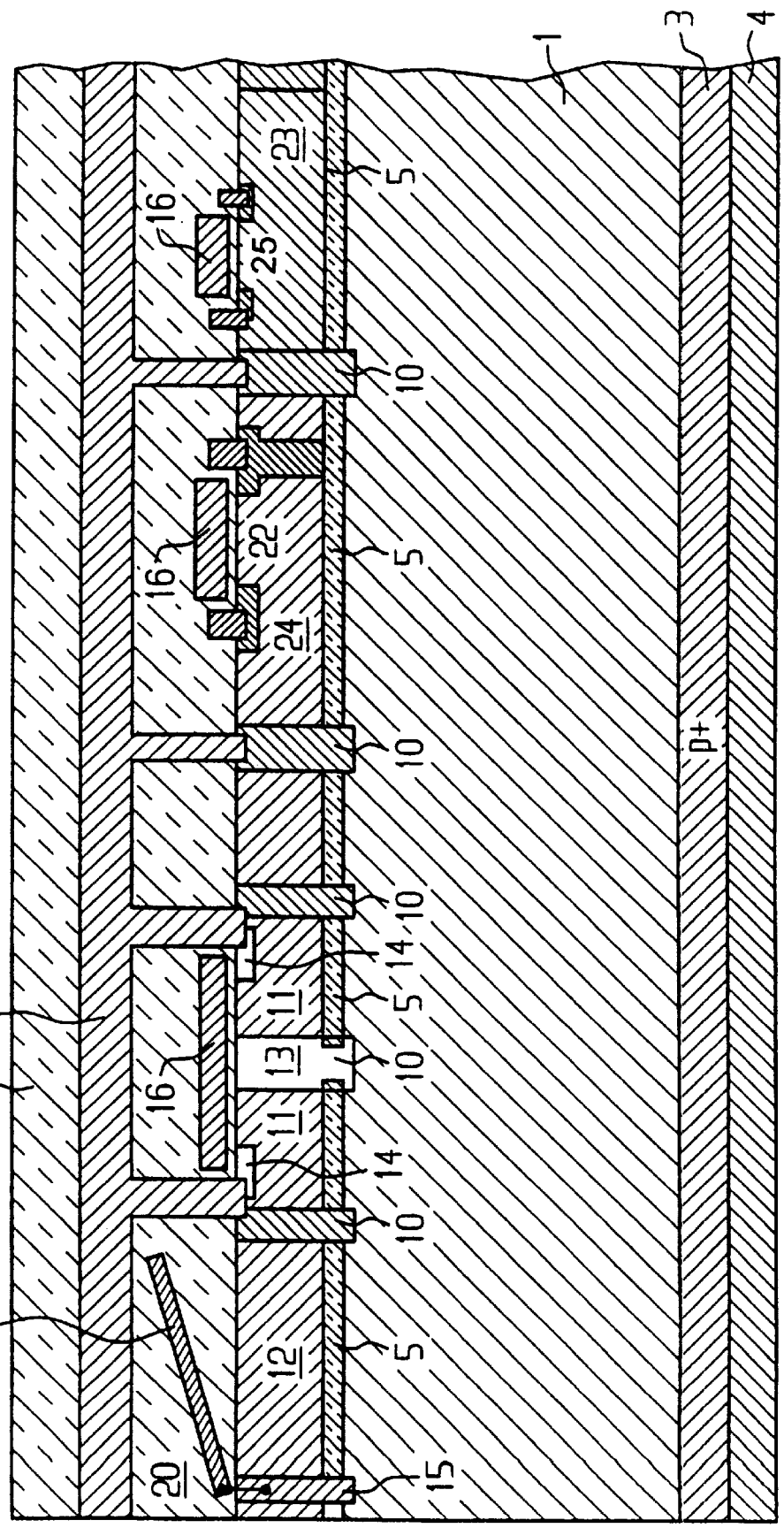

SILICON-ON-INSULATOR INSULATED GATE BIPOLAR TRANSISTOR

CROSS-REFERENCE TO RELATED APPLICATION

This application is a continuation of copending International Application PCT/DE98/03590, filed Dec. 7, 1998, which designated the United States.

BACKGROUND OF THE INVENTION

1. Field of the Invention

The invention relates to an SOI-IGBT (SOI=silicon on-insulator; IGBT=insulated gate bipolar transistor) having a channel zone of a first conductivity type, at least one cell zone of a second conductivity type, and at least one intermediate zone of the first conductivity type which delimits the SOI-IGBT.

It is a constant goal to improve the voltage strength, ruggedness, durability, and the possibilities for integration of IGBTs. For instance, an existing IGBT has a cellular structure in which an n-conducting surface layer is placed between p-conducting cells under a gate of polycrystalline silicon.

SUMMARY OF THE INVENTION

It is accordingly an object of the invention to provide an SOI-IGBT which overcomes the above-mentioned disadvantages of the heretofore-known SOI-IGBTs of this general type and which is improved with regard to its voltage strength, ruggedness, durability, and capacity for integration.

With the foregoing and other objects in view there is provided, in accordance with the invention, a silicon-on-insulator insulated gate bipolar transistor (SOI-IGBT), comprising:

a semiconductor body of a first conductivity type;

an insulator layer formed on the semiconductor body and having openings formed therein;

a channel zone of the first conductivity type, a cell zone of a second conductivity type, and an intermediate zone of the first conductivity type, the intermediate zone delimiting the SOI-IGBT; and the channel zone, the cell zone, and the intermediate zone provided at least partially in the insulator layer and contacting the semiconductor body via the openings.

In accordance with another feature of the invention, a plurality of field plates is disposed above a peripheral zone which adjoins the cell zone.

In accordance with yet another feature of the invention, the channel zone has a gap formed therein.

In accordance with a further feature of the invention, a further cell zone of the second conductivity type is provided. The further cell zone is at least partially disposed in the insulator layer. The openings in the insulation layer include a first and a second opening, the cell zone contacts the semiconductor body via the first opening, the further cell zone contacts the semiconductor body via the second opening. The first and the second openings are spaced apart by a distance that is smaller than a lateral dimension of the peripheral zone.

In accordance with another feature, the SOI-IGBT is integrated with a CMOS circuit.

In an SOI-IGBT, having a channel zone of a first conductivity type, at least one cell zone of the second conductivity type, and at least one intermediate zone of the first conductivity type defining the IGBT, in which the channel zone, cell zone and intermediate zone are disposed in an insulator layer provided on a semiconductor body of the first conductivity type, the object of the invention is achieved in that the channel zone, cell zone, and intermediate zone are connected to the semiconductor body via recesses or openings provided in the insulator layer.

The SOI-IGBT of the invention thus has a cellular structure in which an insulator layer with a layer thickness of 0.1 $\mu$m, for instance, is disposed between a semiconductor body in the form of an $n^-$-conducting silicon substrate, for instance, and the individual cells. Openings are provided in this insulator layer; as a result, $p^+$-conducting cell zones and $n^-$-conducting intermediate zones, for instance, extend into the $n^-$-conducting silicon substrate. Given a suitably selected dopant concentration in the $n^-$-conducting silicon substrate, which can, for instance, have a layer thickness of 50 to 500 $\mu$m, or preferably 100 to 500 $\mu$m, and given a suitably adjusted size of the $p^+$-conducting cell zone, the opening limits the potential of the $n^+$-conducting channel zone under the gate to a low value. The space charge zone in the $n^-$-conducting silicon substrate is constricted or pinched in the region of the opening, under the $n^+$-conducting channel zone, so that the full voltage strength or dielectric strength of the $n^-$-conducting silicon substrate is attained.

The zone that adjoins the cell zone and is thus located between the intermediate zone and the cell zone has the same conductivity type as the cell zone and is more weakly doped than the cell zone. In the above example, this adjoining zone is accordingly $p^-$-doped. In the peripheral region of the IGBT, the adjoining zone acts as a so-called "resurf" structure ("resurf" stands for reduced surface field) and thus contributes to the voltage strength.

Optionally, a field plate may be provided in the peripheral region of the IGBT. With increasing spacing or distance from the edge of the semiconductor body, the field plate has a spacing or distance from the surface of the semiconductor body that increases either steadily or in stages or steps.

In the above example, the hole current flows through the openings in the insulator layer out of the $n^-$-conducting semiconductor substrate into the $p^+$-conducting cell zones. The concentration of the holes and electrons in the $n^-$-conducting silicon substrate increases in the conducting state, with a decreasing surface area of the openings to the $p^+$-conducting cell zones, since an accordingly greater hole-concentration gradient is needed in order to carry the hole current. Furthermore, the voltage drop above the insulator layer decreases with narrower openings in the insulator layer to the $p^+$-conducting cell zones.

In the IGBT of the invention, the "inserted" insulator layer with the openings leads to a greater flooding of the silicon substrate with charge carriers. The zone adjoining the cell zone and placed between the cell zone and the intermediate zone is preferably more expanded than the spacing between two cell zones. This further improves the peripheral structure of the IGBT and achieves a voltage strength on the order of magnitude of far above 600 V. If in addition also the field plate is mounted, the voltage strength is further improved.

The channel zone, which in the above example is $n^+$-conducting, can optionally include a metal or polycrystalline core, which leads to a very rapid recombination of the charge carriers, so that practically no further holes enter the p-conducting zones, which increases the robustness of the IGBT.

The silicon layer on the insulator layer can have a layer thickness of 0.1 to 5 μm, for instance, if the insulator layer, as already noted, is approximately 0.1 μm thick and the silicon substrate has a layer thickness of 50 to 500 μm.

Other features which are considered as characteristic for the invention are set forth in the appended claims.

Although the invention is illustrated and described herein as embodied in an SOI-IGBT, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a fragmentary, cross-sectional view of a third exemplary embodiment of an SOI-IGBT according to the invention, in which $n^+$-conducting channel zones have gaps; and FIG. 4 is a fragmentary, cross-sectional view of a fourth exemplary embodiment of an SOI-IGBT according to the invention, with an integrated CMOS circuit.

DESCRIPTION OF THE PREFERRED EMBODIMENTS

Figure 1:
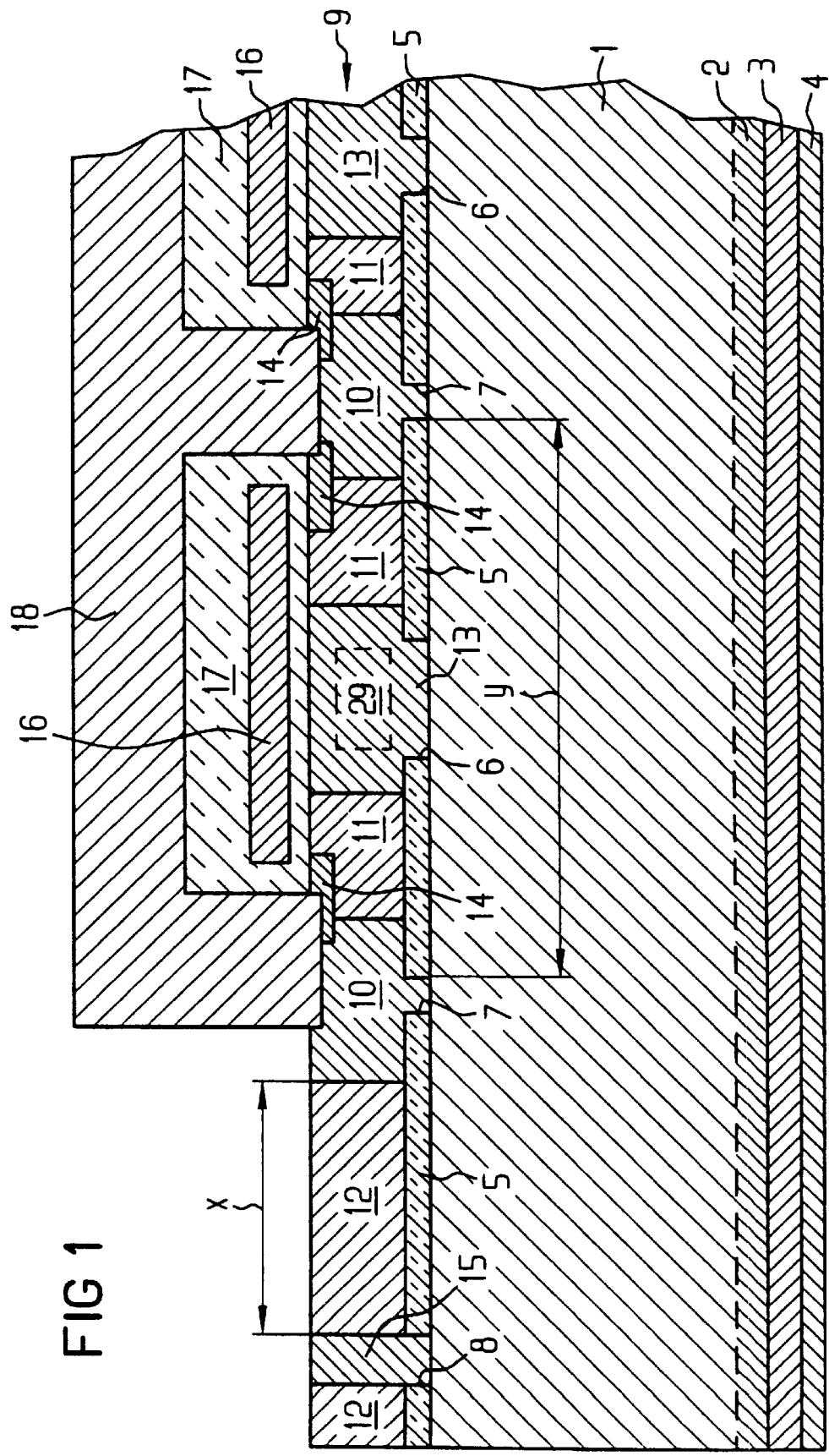
FIG. 1 is a fragmentary, cross-sectional view of a first exemplary embodiment of an SOI-IGBT according to the invention.

Referring now to the figures of the drawings in detail and first, particularly, to FIG. 1 thereof, there is shown a silicon substrate 1 approximately 100 to 500 μm thick, which is $n^-$-conducting and can optionally have an $n^+$-conducting zone 2. This zone 2 or the silicon 1 is adjoined by a $p^+$-conducting zone 3 on which a drain electrode 4 of aluminum, for instance, is applied.

On the side of the silicon substrate 1 opposite the drain electrode 4, an insulator layer 5 is applied, in which there are recesses or openings 6, 7, and 8. On the insulator layer 5, which has a layer thickness of approximately 0.1 μm, a silicon layer 9 is provided, which includes $p^+$-conducting cell zones 10, p-conducting zones 11, a p-conducting peripheral zone 12, an $n^+$-conducting channel zone 13, $n^+$-conducting zones 14, and an $n^+$-conducting intermediate zone 15.

Above the channel zone 13, a gate electrode 16 of polycrystalline silicon is embedded in an insulator layer 17, which, like the insulator layer 5, can be composed of silicon dioxide or silicon nitride, for example. A source metallization 18 made of aluminum, for instance, leads to the $p^+$-conducting zones 10 and to the $n^+$conducting zones 14.

A core 29 of metal or polycrystalline silicon can be embedded in the $n^+$-conducting channel zone 13 and assures a rapid recombination of the charge carriers, so that practically only electrons but no longer holes flow into the p-conducting zones 11.

In the SOI-IGBT of the invention, the potential of the $n^+$-conducting zone 13 below the gate electrode 16 is limited to a low value. The space charge zone in the silicon substrate 1 is constricted below the opening 6, so that the silicon substrate 1 achieves its full voltage strength.

The p--conducting zone 12 in the peripheral region acts as a "resurf" structure and thus contributes to the voltage strength. FIG. 1 illustrates an embodiment with the extent x of this zone 12 being smaller than the distance y between two openings 7. However, preferably, the extent x of the zone 12 should be greater than the distance y between two openings 7.

The hole current flows from the $n^-$-conducting silicon substrate 1 through the recesses or openings 7 into the $p^+$-conducting zones 10. The hole-electron concentration in the $n^-$-conducting silicon substrate 1 increases with a decreasing area of these openings 7, because an increased hole-concentration gradient is necessary to carry the hole current. In addition, the voltage drop decreases with a decreasing distance between the openings 7.

Figure 2:
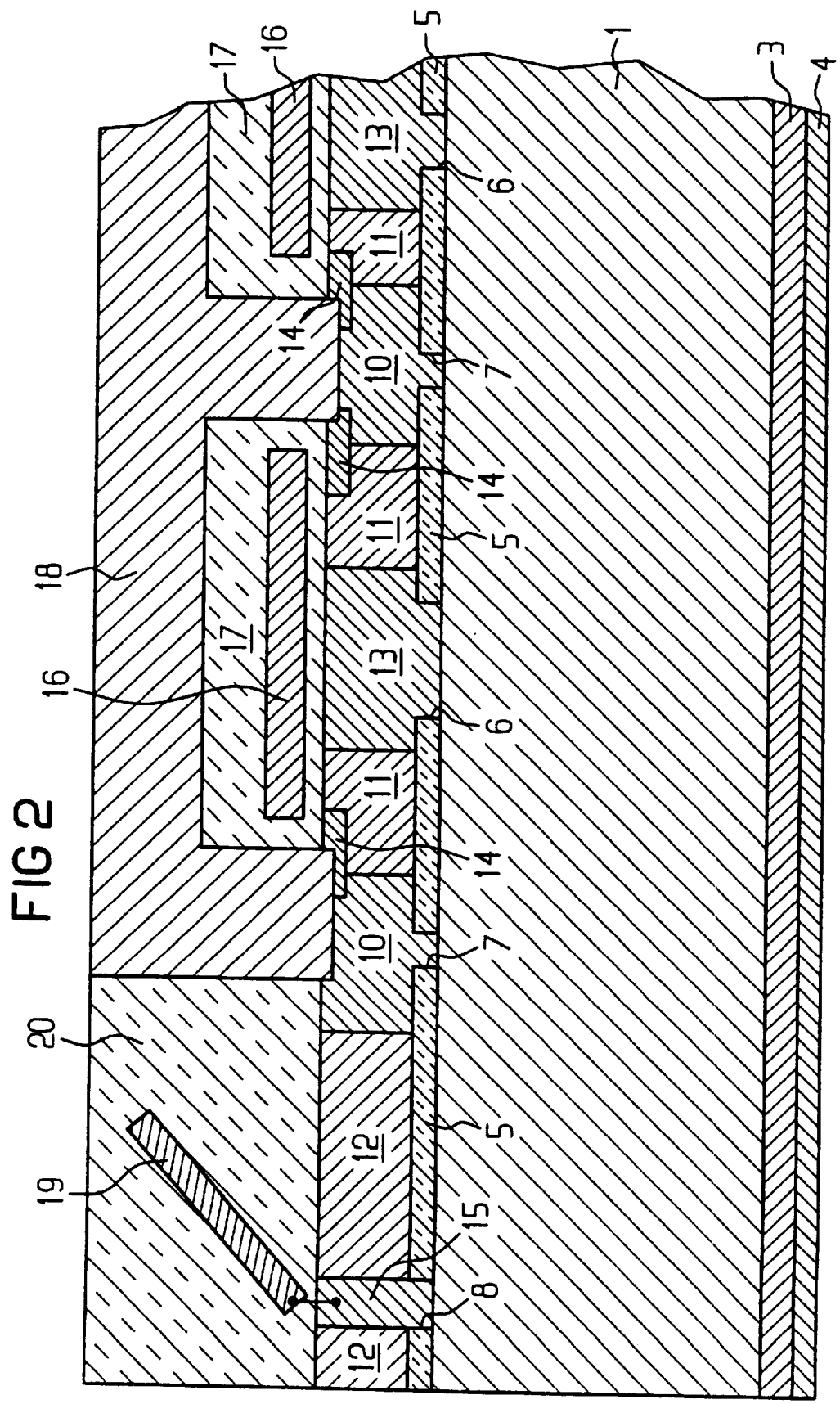
FIG. 2 is a fragmentary, cross-sectional view of a second exemplary embodiment of an SOI-IGBT according to the invention, in which a field plate is provided.

The exemplary embodiment of FIG. 2 differs from the exemplary embodiment of FIG. 1 in that additionally, a field plate 19 is embedded in an insulator layer 20 in the peripheral region of the IGBT and is in conductively connected with the intermediate zone 15. This field plate is placed "obliquely" or "slanted". The field plate 19 has a distance from the surface of the silicon substrate 1 that increases as the distance of the field plate from the edge of the silicon substrate increases. The distance of the field plate from the surface of the silicon substrate 1 can increase either steadily or in steps, in other words the field plates can ascend steadily or in steps. It is also optionally possible to provide a plurality of field plates.

The exemplary embodiment of FIG. 3 corresponds to the exemplary embodiment of FIG. 2 and differs from the embodiment of FIG. 2 in that in addition, gaps, recesses, or openings 21 are provided in the $n^+$-conducting channel zones 13. These gaps 21 in the channels zones 13 are composed of $n^-$-conducting silicon and are accordingly doped identically to the silicon substrate 1.

FIG. 4 shows a further exemplary embodiment of the SOI-IGBT of the invention. The SOI-IGBT is integrated with a CMOS circuit. The CMOS circuit has two complementary MOSFETs 22, 25 in an n-conducting well 23 and a p-conducting well 24, respectively. Between the two wells 23, 24, the $p^+$-conducting zones 10 extend from the source metallization 18 to the silicon substrate 1.

I claim:

1. A silicon-on-insulator insulated gate bipolar transistor (SOI-IGBT), comprising:

a semiconductor body of a first conductivity type;

an insulator layer formed on said semiconductor body and having openings formed therein;

a channel zone of the first conductivity type, a cell zone of a second conductivity type, and an intermediate zone of the first conductivity type, said intermediate zone partially delimiting the SOI-IGBT; and said channel zone, said cell zone, and said intermediate zone provided at least partially in said insulator layer and contacting said semiconductor body via said openings.

2. The SOI-IGBT according to claim 1, including a peripheral zone of the second conductivity type adjoining said cell zone, said cell zone having a first dopant concentration, said peripheral zone having a second dopant concentration lower than said first dopant concentration.

3. The SOI-IGBT according to claim 2, including a field plate disposed above said peripheral zone.

4. The SOI-IGBT according to claim 3, wherein said semiconductor body has an edge, said field plate being disposed such that a spacing distance between said field plate and said semiconductor body increases continuously in a direction away from said edge of said semiconductor body.

5. The SOI-IGBT according to claim 1, wherein said channel zone has a gap formed therein.

6. The SOI-IGBT according to claim 2, including a further cell zone of the second conductivity type, said further cell zone at least partially disposed in said insulator layer, said openings including a first and a second opening, said cell zone contacting said semiconductor body via said first opening, said further cell zone contacting said semiconductor body via said second opening, said first and said second openings spaced apart by a distance smaller than a lateral dimension of said peripheral zone.

7. The SOI-IGBT according to claim 1, wherein said semiconductor body is a silicon substrate having a layer thickness of 100 to 500 $\mu$m.

8. The SOI-IGBT according to claim 1, including a silicon layer having a layer thickness of approximately 0.1 to 5 $\mu$m, said channel zone, said cell zone, and said intermediate zone formed essentially in said silicon layer.

9. The SOI-IGBT according to claim 1, wherein said insulator layer has a layer thickness of approximately 0.1 $\mu$m.

10. The SOI-IGBT according to claim 1, including a metal core disposed in said channel zone.

11. The SOI-IGBT according to claim 1, including a polycrystalline silicon core disposed in said channel zone.

12. A semiconductor configuration, comprising:

a CMOS circuit; and a SOI-IGBT integrated with said CMOS circuit, said SOI-IGBT having a semiconductor body of a first conductivity type, an insulator layer formed on said semiconductor body and having openings formed therein, a channel zone of the first conductivity type, a cell zone of a second conductivity type, and an intermediate zone of the first conductivity type, said intermediate zone partially delimiting said SOI-IGBT, said channel zone, said cell zone, and said intermediate zone provided at least partly in said insulator layer and connected to said semiconductor body via said openings in said insulator layer.

* * * * *